United States Patent [19]
Dore

[11] Patent Number: 5,555,159
[45] Date of Patent: Sep. 10, 1996

[54] ADD-ON MODULE FOR VARIABLE SPEED DRIVES

[75] Inventor: Christophe Dore, Fontenay Le Fleury, France

[73] Assignee: Schneider Electric SA, Boulogne-Billancourt, France

[21] Appl. No.: 357,382

[22] Filed: Dec. 16, 1994

[30]    Foreign Application Priority Data

Dec. 17, 1993 [FR] France .................................. 93 15335

[51] Int. Cl.$^6$ ................... H05K 7/14; H05K 1/14
[52] U.S. Cl. ................ 361/796; 361/748; 361/749; 361/736; 361/789; 361/803; 439/67; 439/59
[58] Field of Search .................... 174/254, 268; 361/748, 749, 752, 728, 736, 743, 744, 745, 755, 740, 747, 759, 784, 785, 789, 791, 796, 801, 803; 439/67, 59, 62, 65, 76, 77

[56]        References Cited

U.S. PATENT DOCUMENTS 4,742,183  5/1988  Soloway et al. ................... 174/254
5,373,149 12/1994  Rasmussen ......................... 361/737
5,408,385  4/1995  Fowler et al. ...................... 361/796

FOREIGN PATENT DOCUMENTS

0505938A1  2/1988  European Pat. Off. .
0256937    9/1992  European Pat. Off. .

*Primary Examiner*—Donald A. Sparks
*Attorney, Agent, or Firm*—Oblon, Spivak, McClelland, Maier & Neustadt, P.C.

[57]          ABSTRACT

An add-on module for a variable speed drive includes a casing containing an electronic circuit and a connector to plug into a corresponding connector on the variable speed drive. The casing is generally L-shaped with a front portion carrying the connector and positioned along the front of the variable speed drive and a side portion accommodated on one side of the variable speed drive. The electronic circuit includes front and side printed circuit boards electrically connected to each other and the angle between which is substantially equal to the angle between the two portions of the casing.

5 Claims, 2 Drawing Sheets

ADD-ON MODULE FOR VARIABLE SPEED DRIVES

BACKGROUND OF THE INVENTION

1. Field of the Invention

The present invention concerns an add-on module adapted to be mounted on a variable speed drive and comprising a casing which contains an electronic assembly and is provided at the rear with a connector which plugs into a corresponding connector on the variable speed drive.

2. Description of the Prior Art

Frequency converter type variable speed drives for controlling the speed of three-phase asynchronous motors essentially comprise a rectifier which supplies a DC voltage to a smoothing filter capacitor (AC-DC converter) and a power transistor inverter (DC-AC converter) energized by the filtered DC voltage.

The variable speed drive provides the most commonly required functions. It can be configured to suit more complex applications by means of add-on options such as:

- an operator dialog add-on to display parameters and faults and the configuration of functions;
- an IBM PC or compatible microcomputer connection add-on for downloading and logging settings;
- an add-on to provide a serial link to an automatic programmable controller bus.

These add-on modules are in the form of a casing containing the electronics and provided at the rear with a connector adapted to be plugged into a connector at the front of the variable speed drive.

An object of the invention is to provide an L-shape add-on module for variable speed drives so that the overall size is minimized. This L-shape facilitates adding a memory card to the module.

SUMMARY OF THE INVENTION

The invention consists in an add-on module adapted to be mounted on a variable speed drive and including a casing containing an electronic circuit and provided at the rear with a connector adapted to plug into a corresponding connector provided on the variable speed drive, wherein the casing is generally L-shape with a front portion carrying the connector adapted to be positioned in front of the front of the variable speed drive and a second portion accommodated on one side of the variable speed drive, the electronic circuit including front and side printed circuit boards electrically connected to each other and the angle between which is substantially equal to the angle between the front and second portions of the casing.

In accordance with one feature of the invention the side board carries a connector for a memory card disposed to enable insertion of the memory card on the side of the case of the variable speed drive.

In accordance with another feature of the invention the two circuit boards are connected by bent pins.

The invention will now be described in more detail with reference to one embodiment of the invention shown by way of example in the appended drawings.

DETAILED DESCRIPTION OF THE PREFERRED EMBODIMENT

Figure 1:
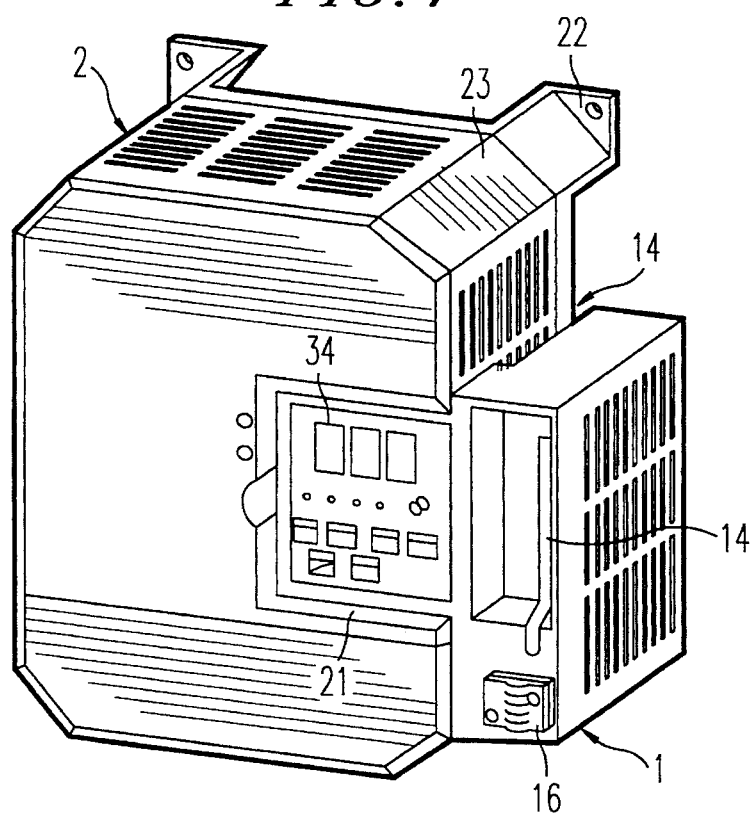
FIG. 1 is a perspective view of the add-on module mounted on the associated variable speed drive.
Figure 2:
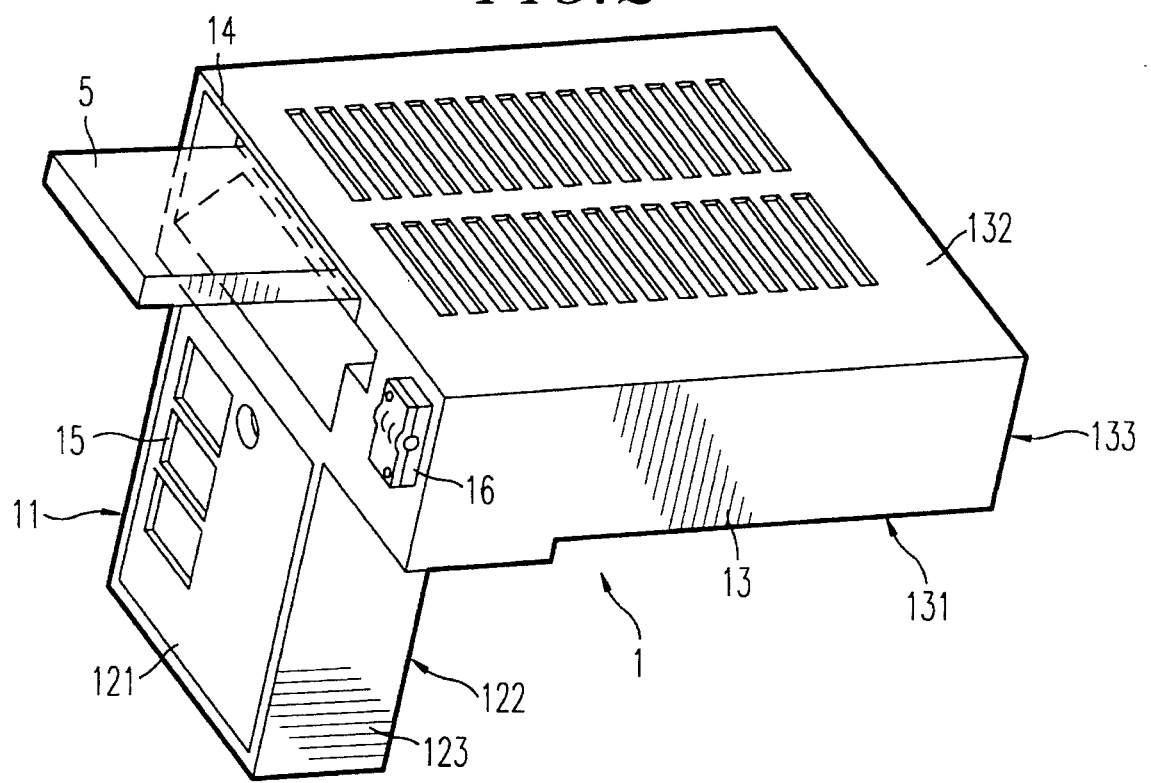
FIG. 2 is a perspective view of the add-on module.
Figure 3:
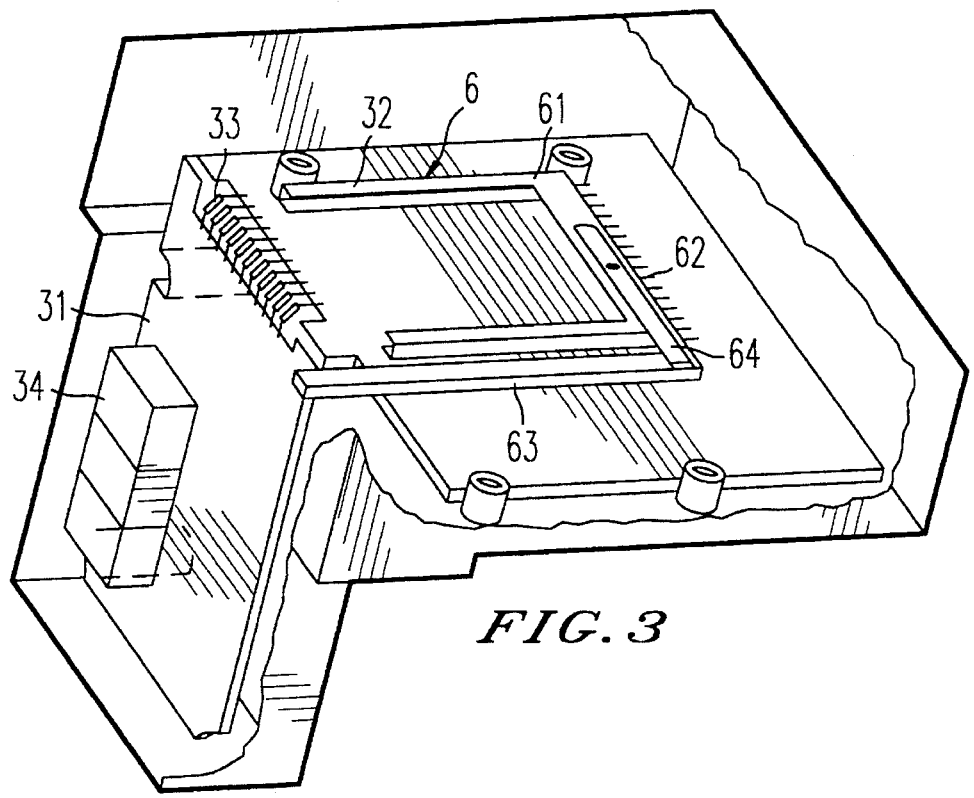
FIG. 3 is a perspective view showing the interior of the add-on module.
Figure 4:
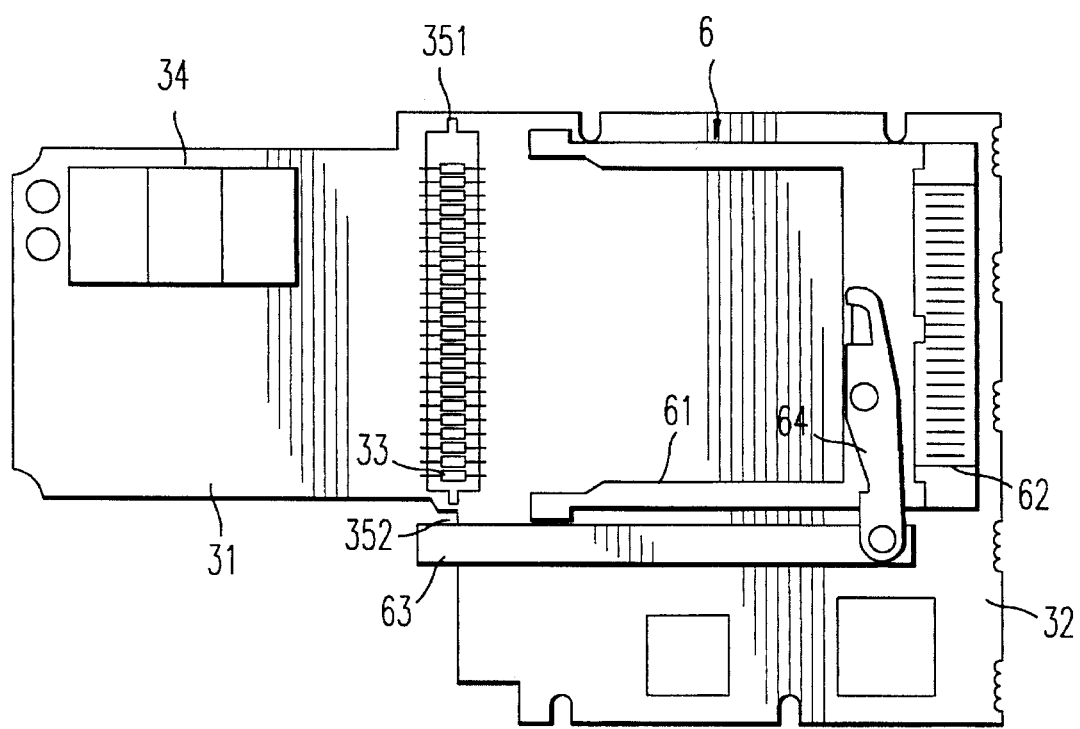
FIG. 4 is a view of the circuit board inside the add-on module, shown before mounting it in the module.

The add-on module of the invention is associated with a variable speed drive 2.

The variable speed drive can be, for example, a solid state frequency converter comprising, in a manner that is known in itself, an inverter connected by a smoothing filter capacitor to a diode rectifier connected to the phase conductors carrying the AC line voltage. The inverter has three bridge arms each connected to a respective phase 1 of an asynchronous motor. Each inverter arm includes, in a manner that is known in itself, two switch mode power components with associated recovery diodes. The center point of each pair of switches of the same arm is connected to a phase winding of the motor. The solid state switches are power transistors or other like switch mode components. A microprocessor-based control circuit controls the power components by turning them on and off in accordance with a defined strategy.

The case 23 of the variable speed drive has fixing lugs 22 at the back.

The case 23 of the variable speed drive has at the front a recess 21 in which a plug-in add-on module 1 can be inserted. The back of this recess carries a multipin male (or female) connector into which plugs the conjugate female (or male) connector of the add-on module 1. The add-on module is either locked into the recess during operation or removed before operation.

The add-on module 1 has a generally L-shape casing 11. The front portion of the casing is parallelepiped shape, delimited by a back 122 which carries the connector, a side 123 which nests in the recess on the variable speed drive and a front 121 which is visible on the front of the variable speed drive when the module is pushed home. The lateral portion of the casing ends flush with the front 121 and has a side 131 which faces the case of the variable speed drive and a side 132 facing outwards. The back 133 of the casing is at the rear of the side of the variable speed drive to which the add-on module is fixed. The side 132 has openings for cooling the electronics. The shape of the module is such that a ventilation space 4 is formed between the side 131 of the module and the side of the case of the variable speed drive.

The front portion of the add-on module casing nests in the recess 21 on the case of the variable speed drive.

The electronic circuit inside it comprises a front printed circuit board 31 and a side printed circuit board 32, the two circuit boards being electrically connected to each other at the corner of the L-shape by bent pins 33. The angle between the two circuit boards is substantially equal to the angle between the front and side portions of the casing.

The front circuit board 31 carries seven-segment displays 34 and other components.

Prior to mounting in the add-on module the two circuit boards 31 and 32 are connected together by two connecting bridges 351 and 352 which break when the board is bent to mount it in the casing 11. The two circuit boards 31 and 32 are electrically connected by the pins 33 which are bent at the time of mounting them in the add-on module.

The module is adapted to receive a PC-MCIA ("Personal Computer Memory Card International Association")

memory card 5 or a card to any other equivalent standard. The side circuit board 32 carries a connector 6 adapted to receive the memory card 5. This arrangement enables insertion of the memory card 5 on the side of the case of the variable speed drive, parallel to the plane of the side circuit board and perpendicular to the plane to which the variable speed drive is fixed. The memory card 5 can be inserted into the connector parallel to one side of the case of the variable speed drive through an opening 14 on the front of the casing 11. The connector 6 incorporates a guide 61 for the card 5 and at the rear the power supply and data pins 62 which connect to the terminals on the memory card 5. The memory card 5 is unplugged by a pushbutton 63 and a pivoting lever 64 operating on the rear of the memory card 5.

The side portion of the casing 11 of the add-on module has on the side facing towards the variable speed drive a tenon key which engages in a fastening groove provided on the side of the case of the variable speed drive. This groove can be in a simpler part fixed to the side of the case of the variable speed drive.

The front 121 of the add-on module has a cable clamp 16 below the opening 14.

It is to be understood that variants of and improvements of detail to the embodiment of the invention described and the use of equivalent means can be considered without departing from the scope of the invention.

There is claimed:

1. An add-on module adapted to be mounted on a variable speed drive, said module comprising:

a casing which houses an electronic circuit;

a connector adapted to plug into a corresponding connector provided on said variable speed drive; and a display formed on a front portion of said casing which displays results of operation of said variable speed drive, wherein said casing is generally L-shaped with said front portion adapted to be positioned along the front of said variable speed drive and a side portion accommodated on one side of said variable speed drive, and said electronic circuit includes front and side printed circuit boards electrically connected to each other and the angle between which is substantially equal to the angle between said front and side portions of said casing.

2. A module according to claim 1, wherein said side circuit board comprises a connector for a memory card disposed to enable insertion of said memory card into an opening in said side portion of said casing.

3. A module according to claim 1, wherein said front and side circuit boards are connected by bent pins.

4. A module according to claim 1, wherein said side portion of said casing comprises fixing means which cooperate with fixing means on said variable speed drive.

5. A module according to claim 1, wherein a cable clamp is provided on said side portion of said casing below said opening for inserting said memory card.

* * * * *